(12) United States Patent
Ku et al.

(10) Patent No.: US 10,431,706 B2
(45) Date of Patent: Oct. 1, 2019

(54) PHOTOACTIVE DEVICE

(71) Applicant: The Regents of The University of Michigan, Ann Arbor, MI (US)

(72) Inventors: Peicheng Ku, Ann Arbor, MI (US); Nanditha Dissanayake, Ann Arbor, MI (US); Brian Roberts, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 58 days.

(21) Appl. No.: 14/176,097

(22) Filed: Feb. 9, 2014

(65) Prior Publication Data
US 2014/0224326 A1 Aug. 14, 2014

Related U.S. Application Data

(60) Provisional application No. 61/762,899, filed on Feb. 9, 2013.

(51) Int. Cl.
*H01L 31/056* (2014.01)
*H02S 40/22* (2014.01)
*H01L 51/44* (2006.01)
*H01L 51/42* (2006.01)

(52) U.S. Cl.
CPC .......... *H01L 31/056* (2014.12); *H01L 51/447* (2013.01); *H02S 40/22* (2014.12); *H01L 51/4253* (2013.01); *H01L 2251/308* (2013.01); *Y02E 10/52* (2013.01); *Y02E 10/549* (2013.01)

(58) Field of Classification Search
CPC .................................................... H01L 31/055
See application file for complete search history.

(56) References Cited

U.S. PATENT DOCUMENTS

| 2009/0059368 A1* | 3/2009 | Kamada | B32B 17/10 |
| | | | 359/489.01 |
| 2009/0225424 A1* | 9/2009 | Zimmer | G02B 26/0808 |
| | | | 359/572 |
| 2009/0229652 A1* | 9/2009 | Mapel | H01L 31/055 |
| | | | 136/246 |

(Continued)

FOREIGN PATENT DOCUMENTS

| WO | WO-2009114620 A2 * | 9/2009 | B82Y 20/00 |
| WO | WO 2013093696 A2 * | 6/2013 | H01L 31/055 |

OTHER PUBLICATIONS

C. Farcau and S. Astilean, "Probing the unusual optical transmission of silver films deposited on two-dimensional regular arrays of polystyrene microspheres", Journal of Optics A: Pure and Applied Optics 9, p. S345-S349 (2007).*

(Continued)

*Primary Examiner* — Eric R Smith
(74) *Attorney, Agent, or Firm* — Reising Ethington P.C.

(57) ABSTRACT

A photoactive device that includes a photovoltaic device having electrodes and at least one photoactive layer between the electrodes. One or more other layers may be included between the electrodes. The device includes a substrate positioned below the photovoltaic device, and a nanostructure backreflective layer positioned below the substrate such that at least some of the incident light impinging on the photovoltaic device passes through the photovoltaic device and the substrate and is backscattered through the substrate to the photovoltaic device.

11 Claims, 12 Drawing Sheets

(56) References Cited

U.S. PATENT DOCUMENTS

| | | | | |
|---|---|---|---|---|
| 2010/0126566 | A1* | 5/2010 | Ji | G02B 5/008 136/252 |
| 2010/0126567 | A1* | 5/2010 | Kaufman | G02B 5/008 136/252 |
| 2010/0218822 | A1* | 9/2010 | Yamasaki et al. | 136/256 |
| 2010/0288352 | A1* | 11/2010 | Ji | H01L 31/02168 136/256 |
| 2011/0109854 | A1* | 5/2011 | Tang | G02F 1/19 349/117 |
| 2011/0259419 | A1* | 10/2011 | Hagemann et al. | 136/259 |
| 2012/0287362 | A1* | 11/2012 | Hashimura | G02F 1/133528 349/15 |
| 2012/0313202 | A1* | 12/2012 | Sato | H01L 31/075 257/432 |
| 2013/0316491 | A1* | 11/2013 | Carroll | 438/96 |

OTHER PUBLICATIONS

V. Srikant and D. R. Clarke, "On the optical band gap of zinc oxide", Journal of Applied Physics 83(10) p. 5447-5451 (1998).*

K.A. Willets and R. P. Van Duyne, "Localized surface plasmon resonance spectroscopy and sensing", Annual Review of Physical Chemistry 58, p. 267-297 (2007).*

C-Y. Chen, Y-L. Lo, "Integration of a-Si:H solar cell with novel twist nematic liquid crystal cell for adjustable brightness and enhanced power characteristics", Solar Energy Materials & Solar Cells 93, p. 1268-1275 (Year: 2009).*

"Introduction to Polarization" [retrieved from https://www.edmundoptics.com/resources/application-notes/optics/introduction-to-polarization/ on Jan. 17, 2019].*

T. M. de Jong et al., "Angular dependence of surface-relief gratings for solar and lighting applications", Proc. of SPIE vol. 8124, 81240D (Year: 2011).*

Y. Galagan et al., "Semitransparent Organic Solar Cells with Organic Wavelength Dependant Reflectors," Applied Physics Letters, 98, 043302, 2011, pp. 1-4.

D.M.N.M. Dissanayake et al., "Plasmonic Backscattering Enhanced Inverted Photovoltaics," Applied Physics Letters, 99, 113306, 2011, pp. 1-4.

T.P. Woodman, "Light Scattering in Porous Anodic Aluminum Oxide Films," Thin Solid Films, 9, 1972, pp. 195-206.

K. Huang et al., "Asymmetric Light Reflectance Effect in AAO on Glass," Optics Express, vol. 19, No. 2, Jan. 2011, pp. 1301-1309.

X. Sheng et al., "Integration of Self-Assembled Porous Alumina and Distributed Bragg Reflector for Light Trapping in Si Photovoltaic Devices," IEEE Photonics Technology Letters, vol. 22, No. 18, Sep. 2010, pp. 1394-1396.

J. Benemann et al., "Building-integrated PV Modules," Solar Energy Materials & Solar Cells, 67, 2001, pp. 345-354.

R. Lunt et al., "Transparent, Near-Infrared Organic Photovoltaic Solar Cells for Window and Energy-Scavenging Applications," Applied Physics Letters, 98, 113305, 2011, pp. 1-4.

D. Li et al., "Energy and Cost Analysis of Semi-Transparent Photovoltaic in Office Buildings," Applied Energy, 86, 2009, pp. 722-729.

R. Bailey-Salzman et al., "Semitransparent Organic Photovoltaic Cells," Applied Physics Letters, 88, 233502, 2006, pp. 1-4.

C. Bohren et al., Absorption and Scattering of Light by Small Particles, "Particles Small Compared with the Wavelength," Chapter 5, Wiley-Verlag GmbH & Co., 2004, pp. 130-157.

J. Byun et al., "Highly Ordered Nanoporous Alumina on Conducting Substrates with Adhesion Enhanced by Surface Modification: Universal Templates for Utrahigh-Density Arrays of Nanorods," Advanced Materials, 22, 2010, pp. 2028-2032.

M. Cansizoglu et al., "High Optical Absorption of Indium Sulfide Nanorod Arrays Formed by Glancing Angle Deposition," ACS Nano, vol. 4, No. 2, 2010, pp. 733-740.

S. Chaney et al., "Aligned Silver Nanorod Arrays Produce High Sensitivity Surface-Enhanced Raman Spectroscopy Substrates," Applied Physics Letters, 87, 031908, 2005, pp. 1-4.

H. Atwater et al., "Plasmonics for Improved Photovoltaic Devices," Nature Materials, vol. 9, Mar. 2010, pp. 205-213.

A. F. Oskooi et al., "Meep: A Flexible Free-Software Package for Electromagnetic Simulations by the FDTD Method," Computer Physics Comm., 181, 2010, pp. 687-702.

B.Roberts et al., "Broadband Characteristics of Surface Plasmon Enhanced Solar Cells," IEEE Photovoltaic Specialists Conference (Institute of Electrical and Electronics Engineers, New York, 2010), pp. 2952-2954.

A. Rakic et al., "Optical Properties of Metallic Films for Vertical-Cavity Optoelectronic Devices," Applied Optics, vol. 37, No. 22, 1998, pp. 5271-5283.

E. Lioudakis et al., "Optical Properties of Conjugated poly (3-hexylthiophene)/[6,6]-phenylC61-butyric acid methyl ester Composites," Journal of Applied Physics, 102, 083104, 2007, pp. 1-6.

B. Smits, "An RGB to Spectrum Conversion for Reflectances," Journal of Graphics Tools, 4(4), 11, 1999, pp. 1-10.

M. Deru et al., "U.S. Department of Energy Commercial Reference Building Models of the National Building Stock," National Renewable Energy Laboratory, 2011, pp. 1-118, http://www.nrel.gov/docs/fy11osti/46861.pdf.

B. Roberts et al., "Angular Selective Semi-Transparent Photovoltaics," Optics Express, vol. 20, No. 4., 2012, pp. 265-269.

D.M.N.M. Dissanayake et al., "Angular Selective Backreflector for Semitransparent Photovoltaics," Applied Physics Letters, 101, 063302, 2012, pp. 1-5.

C.Yang et al., "Fabrication of Anodic Aluminum Oxide Film on Large-Area Glass Substrate," Electrochemical and Solid-State Letters, 10 (12), pp. C69-C71.

* cited by examiner (a)

US 10,431,706 B2

PHOTOACTIVE DEVICE

CROSS-REFERENCE TO RELATED APPLICATION

This application claims the benefit of U.S. Provisional Application No. 61/762,899 filed Feb. 9, 2013, the entire disclosure of which is hereby incorporated by reference.

STATEMENT REGARDING FEDERALLY-SPONSORED RESEARCH

This invention was made with government support under DE-SC0000957 awarded by the Department of Energy. The government has certain rights in the invention.

TECHNICAL FIELD

This invention relates generally to photovoltaic devices for light absorption.

BACKGROUND OF THE INVENTION

There is a continuing drive towards the use of solar energy as an alternative to fossil fuels. One approach for making solar energy compete favorably with fossil fuels is to increase the power conversion efficiency while reducing the cost. Thin-film photovoltaics (PVs) such as organic polymer and amorphous silicon PVs are useful as solar cells and show promise as economically viable alternatives to fossil fuels. However, in order to compensate for their poor charge transport, the absorber thickness in these PV structures is typically limited to few hundred nanometers, resulting in incomplete light harvesting and subsequently lower power conversion efficiency.

SUMMARY

In accordance with one aspect of the invention there is provided a photoactive device comprising a photovoltaic device having electrodes and one or more layers between the electrodes that includes at least one photoactive layer, a substrate positioned below the photovoltaic device, and a nanostructure backreflective layer positioned below the substrate such that at least some of the incident light impinging on the photovoltaic device passes through the photovoltaic device and the substrate and is backscattered through the substrate to the photovoltaic device.

In accordance with another aspect of the invention there is provided a photoactive device, comprising a photovoltaic device for absorbing incident light having electrodes and one or more layers between the electrodes that includes at least one photoactive layer, and a substrate positioned below the photovoltaic device comprising a plurality of nanoparticles for backscattering light that has passed through the photovoltaic device, wherein the plurality of nanoparticles increase the absorption of incident light that is received at an angle other than normal to photoactive device.

BRIEF DESCRIPTION OF THE DRAWINGS

Preferred exemplary embodiments of the invention will hereinafter be described in conjunction with the appended drawings, wherein like designations denote like elements, and wherein.

DETAILED DESCRIPTION OF THE ILLUSTRATED EMBODIMENTS

Transparent photovoltaics (TPV) are actively pursued as a viable technology for building integrated solar energy harvesting. It may be desirable in TPV design to obtain high optical transparency while maximizing the power conversion efficiency. These properties may pose conflicting design constraints, as improving power conversion efficiency demands higher optical density, thereby leading to reduced transparency. Recently, several techniques have been proposed to lift the above-referenced limitation. In some implementations, TPVs may be designed to absorb only the infrared light and transmit the visible wavelengths without attenuation for transparency. However the visible region carries approximately 47% of the AM1.5 G spectrum; therefore, the visible region may be used for maximum performance in TPVs.

As described herein, photoactive devices may include photovoltaic (PV) devices and other suitable layers of material for absorbing, reflecting, or transmitting light—according to the desired application. Several implementations are described herein for improving the photoactive device's performance; the photoactive device implementations having various suitable backreflective structure(s). In one implementation, the photoactive device may include a plurality of backreflective structures and the backreflective structures may be nano-sizes particles or nanoparticles (e.g., metal nanoparticles carried by a substrate). The nanoparticles may vary in shape and size (e.g., nanoparticle rods, ellipsoids, etc.). In another implementation, the backreflective structure(s) of the photoactive device may be a film, sheet, layer, or stratum which acts as an angular selective backreflective layer (e.g., made of any suitable material, such as a porous dielectric material); while other implementations are possible, the illustrated embodiments are made of an anodized aluminum oxide (AAO).

Nanoparticle Backreflective Structures in Photovoltaics

Figure 1:
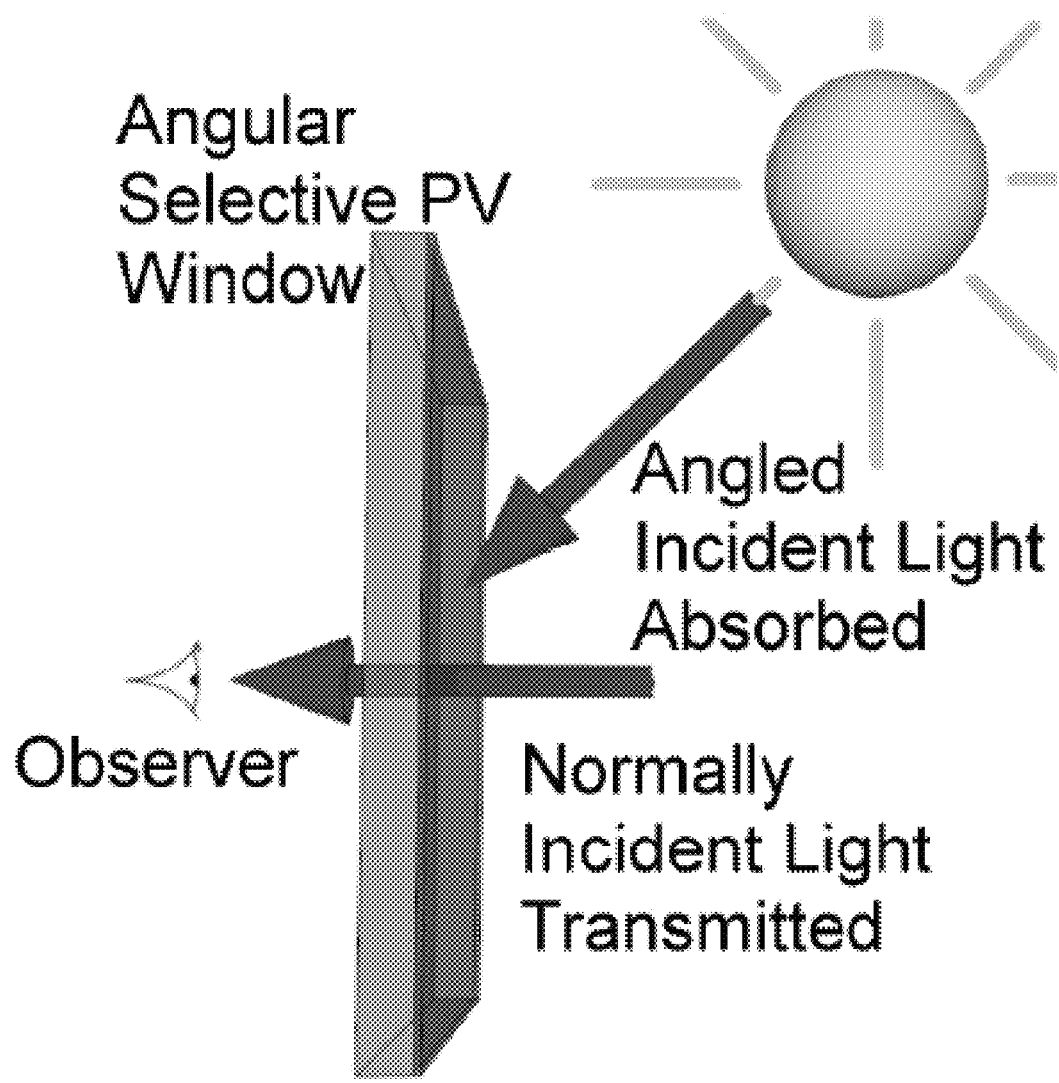
FIG. 1 is an exemplary environment for a backreflective structure in a photoactive device.

One implementation that may improve the performance of photoactive devices is the use of multiple nanoparticles such as nano-rods or nano-ellipsoids within an angular selective backreflector (or backscattering) layer. The photoactive device may be used, for example, with a building window—allowing high window transparency for normally incident light while facilitating enhanced harvesting of direct sunlight entering from an elevated angle, as shown in FIG. 1. As light passes through the semi-transparent PV layer, it may either go through the angular selective back reflector or may be reflected back to the PV absorber again, according to the angle of incidence. The amount of absorption may be tuned by controlling the distance between the PV absorber and the angular selective backreflector via an optical cavity effect, which will be appreciated by skilled artisans.

A proof of principle was established via experimental testing. To show that the proposed angle selective PV device may be potentially realized for a large area in a scalable fashion, an array of anisotropically shaped subwavelength metal nanoparticles was used; however, it will be appreciated that the nanoparticles used in experimental testing were merely exemplary and that other suitable particles may be used. Here, silver (Ag) particles were chosen; however, other suitable materials may be used. As will be appreciated by skilled artisans, the scattering resonance of the anisotropically shaped metal nanoparticle depends on the polarization direction of the light with which it is illuminated. And the polarization is determined by the angle of incoming light, providing a method of angular selectivity. For elliptical metal particles, a short wavelength localized surface plasmon (LSP) resonance is obtained for light polarized along a minor ellipse axis and a red-shifted LSP response is seen for light polarized along the major axis. Using these determinations, a monolayer of nanoparticles may be designed to scatter different portions of the spectrum as the angle (and thus the polarization direction) of the incident light may be changed.

Figure 2:
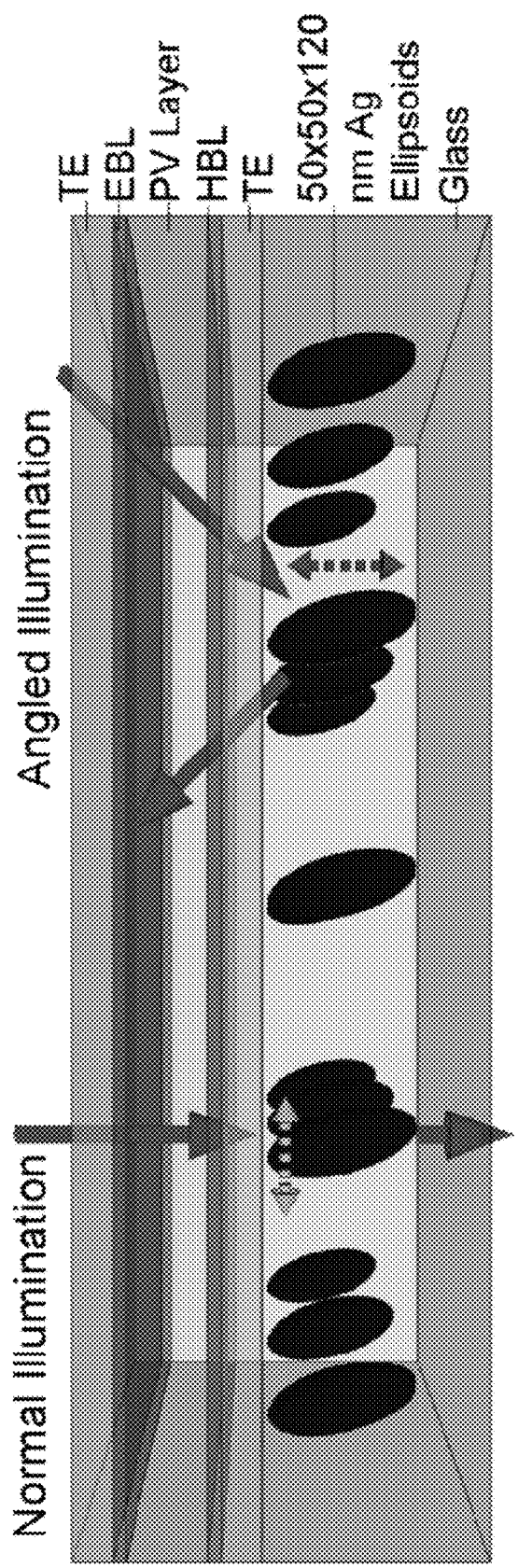
FIG. 2 is diagrammatic sectional view of one embodiment of the backreflective structure.

The angular selective backscattering layer is shown schematically in FIG. 2. An array of elliptical-shaped (or ellipsoid) silver nanorods were placed behind a planar thin film PV, with the long ellipse axes approximately normal to the PV layer. Such a structure may be potentially fabricated using a number of techniques known to skilled artisans, such as electrodeposition with an anodized aluminum oxide guide or device or using oblique angle deposition. The spectral locations of the long and short axis LSP resonances may be determined by the silver nanorod shape and aspect ratio, the surrounding dielectric material, and to a lesser extent, the size of the particle relative to the optical wavelength. 120 nm by 50 nm elliptical particles were chosen to demonstrate a clear resonance splitting in simulations. The particles were spaced approximately 200 nm apart to maintain a transparency of approximately 70% while having adequate metal nanoparticle density for significant scattering effects. Other particle spacing is possible. For each particle to scatter as much light as possible, they were spaced out far enough that their resonant scattering cross sections did not overlap. Adequate spacing may also mitigate coupled resonance effects. In addition, periodic spacing may also affect scattering via Bloch-type modes.

As shown in FIG. 2, the metal particles are shown oriented with a 15-degree rotation with respect to the normally incident light. The additional rotation allows for fine tuning of the angles of light that are targeted for maximum backscatter albeit at the cost of a small component of the long wavelength characteristics emerging at normal incidence. The metallic nanoparticles may be placed completely outside the electrical and optical paths of the PV device itself, eliminating any adverse effects on charge transport and collection. Furthermore, the independent design and/or manufacture of the angle selective backreflector layer and the PV device enables control of the spacing therebetween; the spacing may be altered to alter the amount of absorption according to the optical cavity effect.

During the experimental testing, analysis of the optical properties of the metal nanoparticle backreflector layer was conducted using full-field finite-difference time-domain (FDTD) optical simulations. A 3-dimensional volume representing the active region of the photoactive device was defined, containing the geometry shown in FIG. 2. Five nano-ellipsoids were simulated across the x-direction of the region. In the y-direction, periodic boundary conditions were used to reduce computation time. Perfectly matched layers (PML) boundaries were enforced in the x- and z-directions. Objects were modeled by their complex dielectric constant $\varepsilon=\varepsilon'+i\varepsilon''$. For silver particles, the frequency dependence of $\varepsilon$ was approximated using a Lorentz-Drude model fit to tabulated data. The 60 nm thick PV absorber layer was modeled with a refractive index n=1.8 and an absorption coefficient $\alpha=5\times10^4$/cm, approximating the absorption band of an organic polymer PV system. This absorption was treated as constant across all wavelengths purely to improve the clarity of the results. It should be appreciated that other thin film material system may be used.

A broadband pulse of spatially coherent planar light was propagated through the testing structure, starting from the transparent electrode layer. The initial interface between air and the dielectric stack, assumed to be further from the PV layer than the coherence length of sunlight, was neglected for computational simplicity. The Fourier-transformed optical flux entering each object in the simulation, given by the Poynting vector, was used to determine absorption spectra. The response to angled incident light was simulated by angling the geometry within the x-z plane with respect to the planar source.

Figures 3A, 3B:
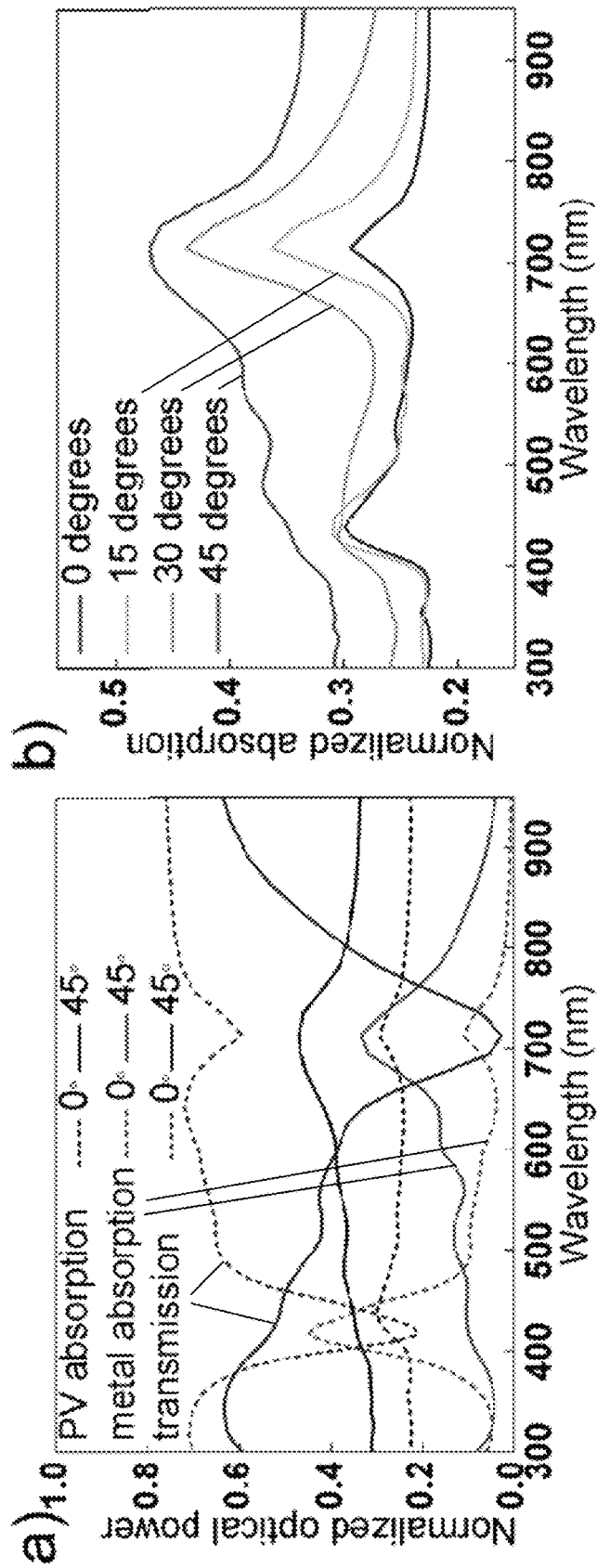
FIG. 3(a) is a graphical representation of experimental data.
FIG. 3(b) is another graphical representation of experimental data.

FIGS. 3(a) and 3(b) show results of the electromagnetic simulation of the device active region in the spectral domain. Normally incident light (dashed curves of FIG. 3(a)) shows a drop in transmission (uppermost dashed curve) and significant metal nanoparticle absorption (lowermost dashed curve) around the 400 nm LSP resonance associated with the minor axis of the metal particles. Much of the visible spectrum after 450 nm was transmitted with approximately 70% intensity, with the exception of a small perturbation at 700 nm, associated with the particles not being perfectly vertically aligned. Transverse magnetic (TM) polarized light at 45 degrees (solid curves) showed significant interaction with the major ellipse axis and the corresponding 700 nm LSP resonance. There was a broad corresponding peak in improved absorption by the PV material (middle solid curve), and a drop in device transmission (upper solid curve). A factor of 1.7 in improved PV layer absorption was realized for TM light near the shifted LSP resonance. And as shown by FIG. 3(b), it was observed that the influence of the shifted LSP resonance on absorption increased with increasing angle of incident light.

A number of tradeoffs and limitations may be considered when determining device performance. The inclusion of metal nanoparticles may be accompanied by intrinsic optical losses (lower curves of FIG. 3(a)). For such structures to be effective, the advantages of spectral control, used here to enable angular selectivity, should outweigh the optical losses. Furthermore, the metal nanoparticles may only target the TM components of angled incident light. It is possible to design plasmonic structures to scatter both polarizations of angled light (e.g., nanodisks rather than nanorods), though such structures would not be as highly transparent to normally incident light. While the scattering mechanism may be optimized for TM light, both polarizations may realize some improved absorption of angled light due to the longer angled path length through the PV layer. Additionally, the Fresnel equations dictate that angled light near Brewster's angle may have a more significant TM component after transmission from the air into the dielectric layers on the front surface of the PV device, making targeting of TM light more advantageous.

Figures 4A, 4B:
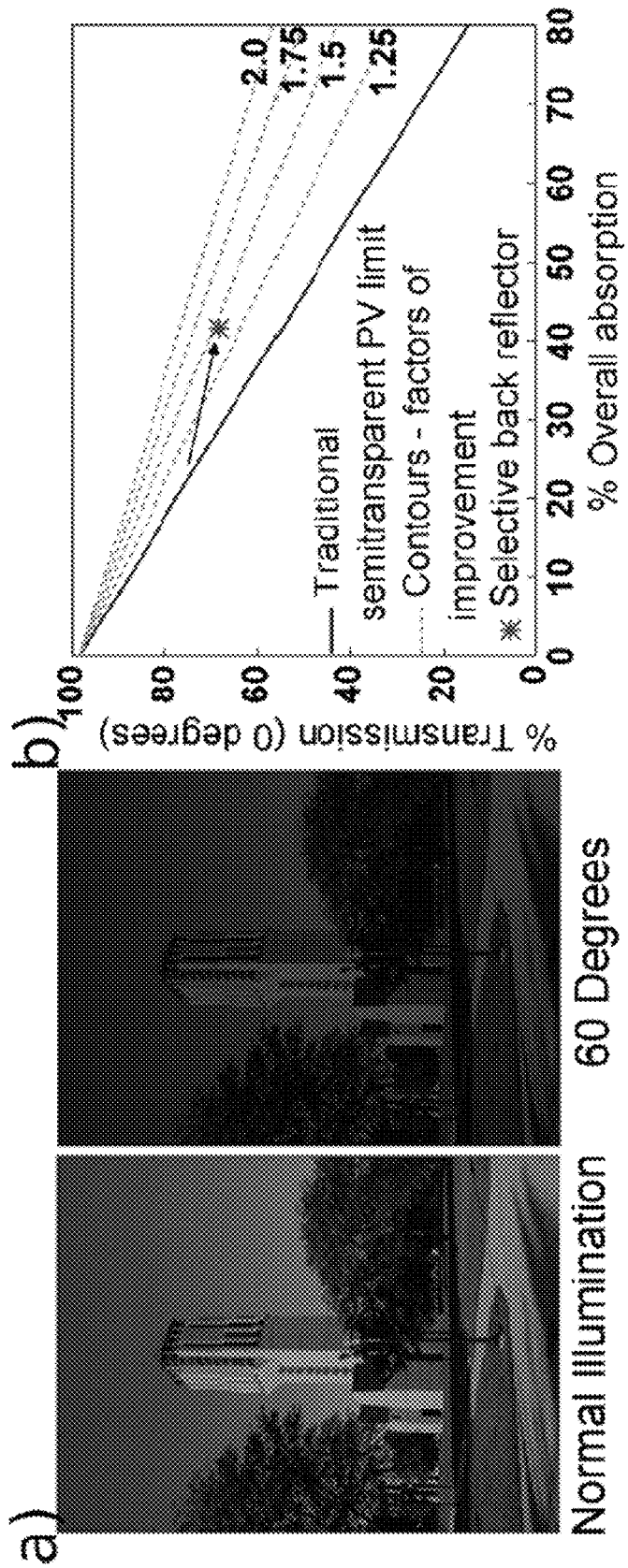
FIG. 4(a) includes two images exemplifying the experimental data.
FIG. 4(b) is another graphical representation of experimental data.

Experimental testing was conducted using the FDTD transmission spectra to simulate the appearance of an RGB (or red/green/blue color) image as seen through the window at different incident angles. The image maintained good optical quality and brightness at normal incidence, with transmission degraded only at high incident angles, as shown in FIG. 4(a) [the image being reproduced here in black and white]. Lastly, weight was given to the simulated performance spectra by the AM1.5 solar spectrum and the angular availability of direct sunlight, including the contributions from both TM and TE polarized light. In FIG. 4(b), the tradeoff between total absorption of solar power (x-axis) and transmission of visible light at normal incidence (y-axis) was plotted. The solid line marks the upper transparency limit for a given amount of PV absorption in a conventional transparent PV structure. FIG. 4(b) illustrates that the angular selective harvesting of light with this structure improved solar absorption while maintaining transparency, with a simulated improvement factor of 1.44 (the star (*)). Thus, it has been shown that the PV power conversion efficiency may be improved by a factor of 1.44 while maintaining up to 70% optical transparency for normally incident light.

As previously discussed, other backreflective structure(s) are possible other than the described metal nanoparticles. For example, as described below, the backreflective structure may include a film, sheet, layer, or stratum as part of the photoactive device.

Dielectric Backreflective Structures in Photoactive Devices

Another apparatus and method to increase absorption without penalizing transparency may be to control the passage of transmitted vs. absorbed light as a function of the angle of incidence using a backreflective structure that is a nanostructured layer or template. In this implementation, for a vertical absorber, direct sunlight incident at high elevation angles to the horizontal may be significantly captured for power generation. As a result, the maximum average solar irradiance per year incident on southward (northward) facing vertical facade in the north (south) hemisphere may be harvested. Simultaneously, high optical transmission may be maintained orthogonal to the substrate (horizontal)—e.g., to provide natural lighting via the angular selective PV window shown in FIG. 1. As a result, high visibility through the field of view around the horizontal direction may be created and tailored to transparent building integrated photovoltaics (BI-PVs).

The backreflective nanostructured layer may be made of any suitable material having suitable scattering properties. In the embodiment described herein, the nanostructured layer is a nanoporous anodized aluminum oxide (AAO) where light scattering occurs within a porous high bandgap dielectric substrate, eliminating absorption losses in the visible region and preserving higher transparency. Furthermore, scattering in AAO may be non-resonant leading to capture of broader spectral region from AM1.5 G for energy harvesting. As a result, using the unique light scattering properties in AAO nanostructured layers, close to a 35% increase in backscattering may be obtained within the visible region up to 700 nm at a 45 degree elevation angle for a substrate placed vertical to ground. High optical transparency, limited only by the single-pass attenuation via the active-layer, may be maintained orthogonal to the substrate (horizontal). Therefore, using a prototype organic TPV, absorption losses may be minimized and higher transparency may be preserved (it will be appreciated by skilled artisans that there is an inherent tradeoff between the amount of visible light that can be converted into photocurrent versus the amount that must be transmitted through the window for daylight illumination, aesthetics, and other benefits). Furthermore, such AAO nanostructured layers may be retrofitted to any suitable type of TPV (including silicon solar cells) preserving the scalability and lowering manufacturing costs.

A proof of principle was established via experimental testing. Whatman AAO membranes were used having a 200 nm pore diameter with a 300 nm pore separation and a 60 μm thick through-hole. Angle dependent direct and integrated transmission (and reflection) measurements were carried out using a custom setup including a monochromator (Princeton Instruments, SP2300) and integrating sphere (Sphereoptics) via lock-in techniques. Samples were illuminated using a 200 W tungsten-halogen lamp (Hamatsu). TPVs were fabricated by using a 1:1 blend of poly-3-hexythiophene (P3HT) with phenyl-C61-butyric acid methyl ester (PCBM) spin coated on a ZnO coated indium tin oxide substrates (ITO) (Delta Technologies) together with a 9-nm Au top contact. The active device areas were 1 $cm^2$. AAO membranes soaked with de-ionized (DI) water were placed on the ITO glass substrate. The control and AAO integrated TPV devices were illuminated via the transparent thin Au contact.

Figure 5:
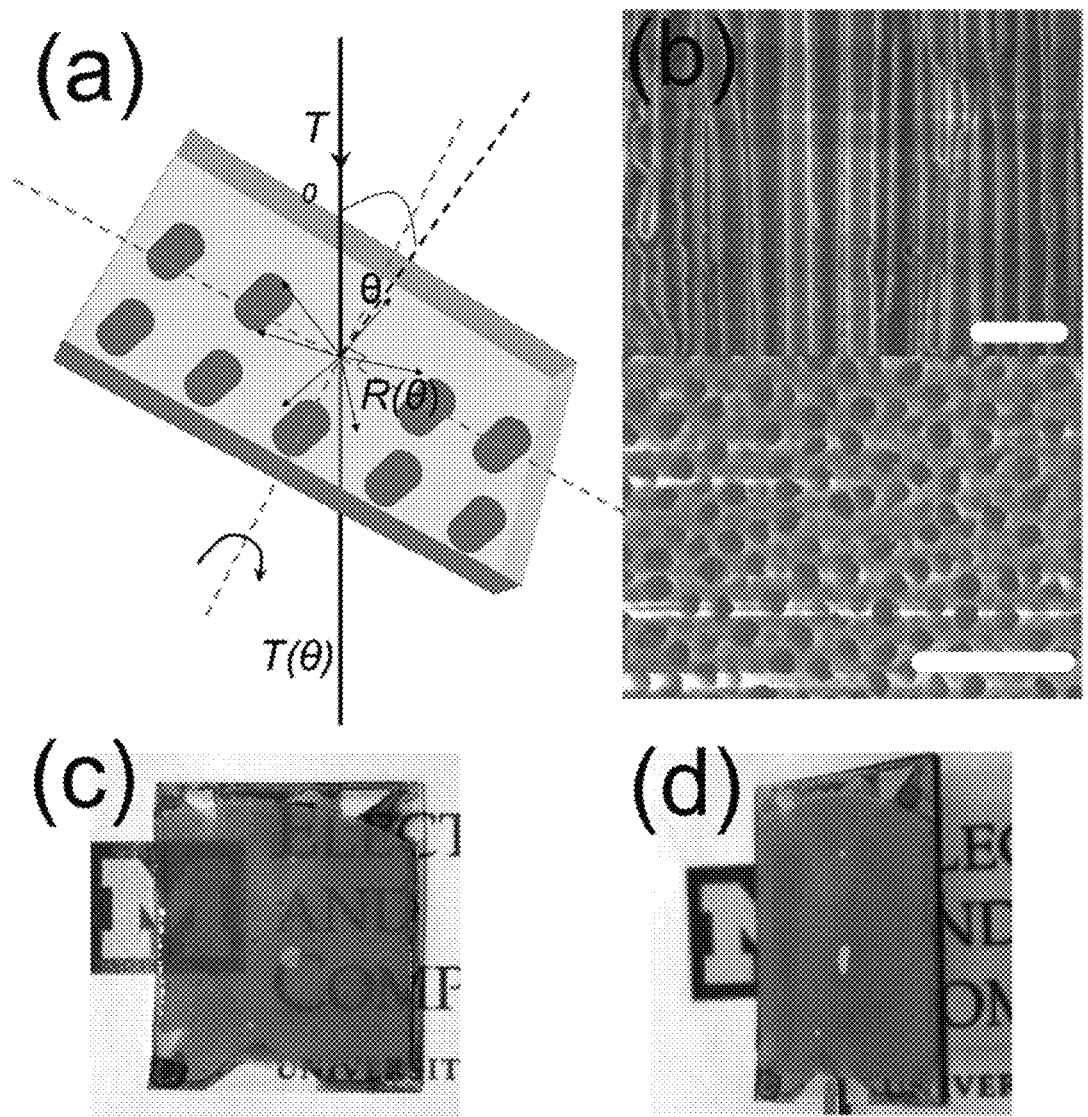
FIG. 5(a) is another embodiment of the backreflective structure.
FIG. 5(b) is a cross-sectional view of the backreflective structure.
FIG. 5(c) is the backreflective structure angled at approximately 0 degrees.
FIG. 5(d) is the backreflective structure angled at approximately 45 degrees.

An AAO nanostructured layer is one embodiment of infinitely long, sub-wavelength, and periodic cylindrical pores within a dielectric. The optical density of AAO may reduce significantly with increasing wavelength due to bulk and surface scattering and interference effects. FIG. 5(a) shows the angular dependent transmission and reflection measurements on a 60 μm thick AAO nanostructured layer with 200 nm pores with approximately 300 nm separation (see also FIG. 5(b)) kept flushed against a P3HT:PCBM (100 nm) film. Upon soaking in DI-water, the AAO nanostructured layer may become transparent at orthogonal direction (see also FIG. 5(c)). However, when tilted at an angle approximately greater than 45 degree elevation to horizontal, the AAO may become translucent cutting-off direct line-of-site viewing (see also FIG. 5(d)).

Figure 6A:
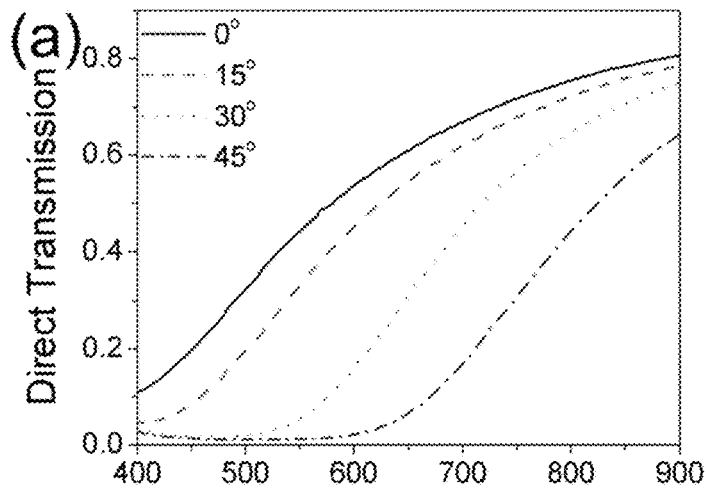
FIG. 6(a) is another graphical representation of experimental data.

Now turning to FIG. 6(a), a line-of-sight transmission is shown graphically through the AAO nanostructured layer with AAO placed at angles 0-45 degrees to the incidence. When angle of incidence was increased from 0 to 45 degrees, direct transmission, measured at line-of-sight, decreased at wavelengths 400-600 nm. (transmission at 600 nm dropped from 0.52 (0°) to 0.45 (15°), 0.15 (30°) and 0.02 (45°). Furthermore regarding the optical power distribution, integrated transmission and reflection (FIG. 6(b)) was carried out, capturing forward and backward scattering from all angles. The integrated transmission intensity (FIG. 6(b)) was observed to be higher than the direct transmission (FIG. 6(a)), irrespective of angle of incidence. (i.e., at 45 degrees the 600 nm integrated transmission was measured at 60 percent compared to the measured less than 0.02 percent of direct transmission at line-of-sight). Therefore a significant proportion of transmitted light was scattered obliquely away from line-of-sight when propagated through the AAO nanostructured layer at each angle of incidence. However, even the integrated transmission was reduced up to 24 percent between 400 -700nm wavelengths when the angle of incidence was increased from 0 degree (circles) to 45 degree (squares) (integrated transmission decreased from 0.85 (0 degree) to 0.61 (45degree) at 600 nm).

Figure 6B:
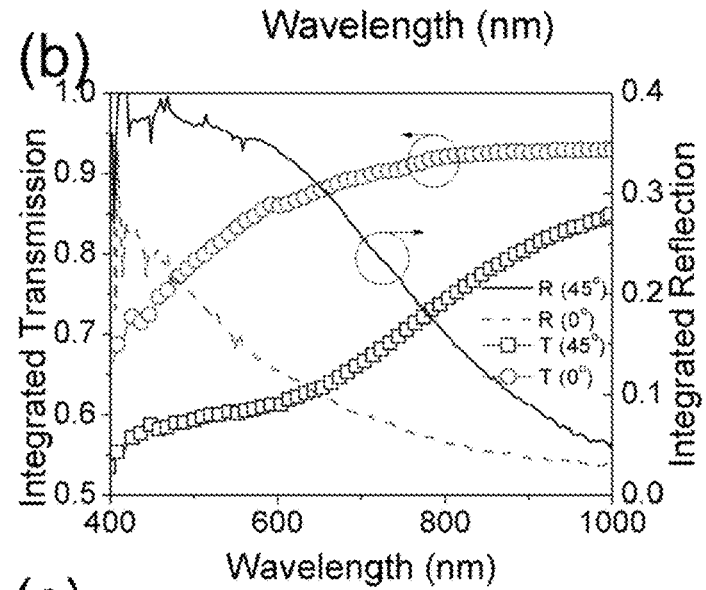
FIG. 6(b) is another graphical representation of experimental data.
Figure 6C:
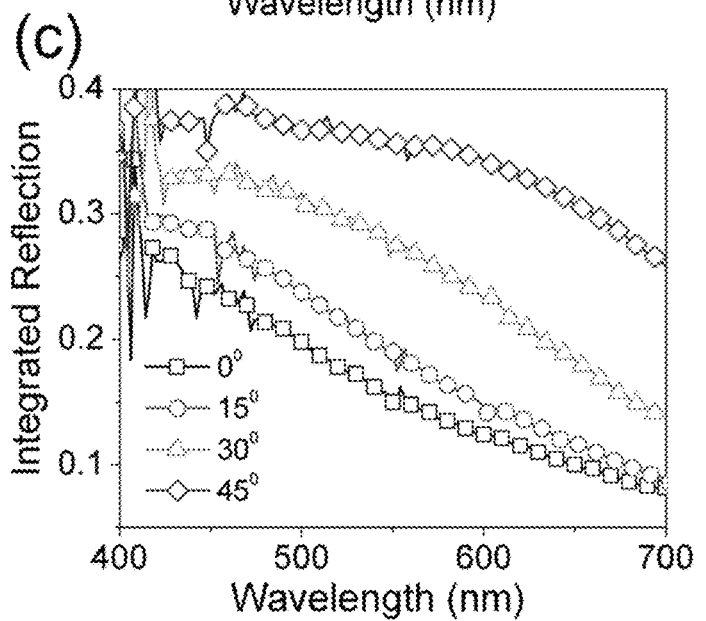
FIG. 6(c) is another graphical representation of experimental data.

In order to account for the loss in transmission, reflection (backscattering) from the top AAO surface was measured at varied incident angle (FIG. 6(b)). Accordingly, backscattering increased at higher angles of incidence from 0 degree (dash line) to 45(solid line) degrees, gaining up to 22 percent between 400-700 nm (i.e. 600 nm reflection was increased from 0.12 (0 degree) to 0.34 (45 degree)). Therefore, an increase in backscattering was obtained at higher elevation angles, commensurately decreasing the transmission through the AAO nanostructured layer. FIG. 6(c) illustrates the integrated reflection from 0 to 45 degrees. Thus, the back reflection at a 45-degree angle (squares) was greater than 35-percent between the 400 to 650 nm spectral regime overlapping with the highest irradiation regime of the solar spectrum. This optical backscattering formed the basis for utilizing AAO nanostructured layers as one embodiment of an angular selective backscatter in TPVs.

Figure 7A:
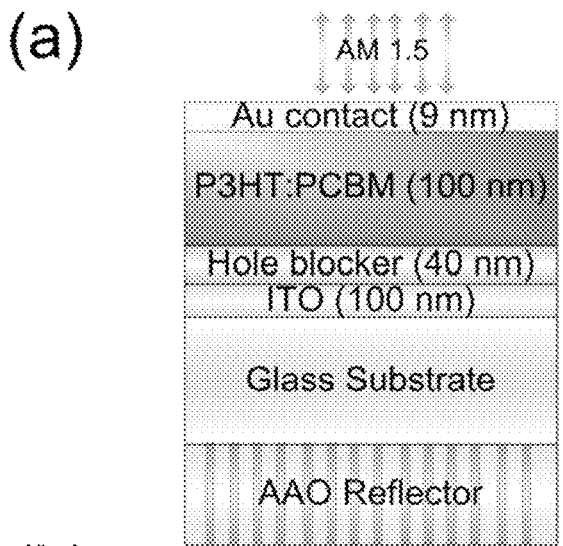
FIG. 7(a) is a diagrammatic view of one embodiment of the photoactive device of FIG. 1.
Figure 7B:
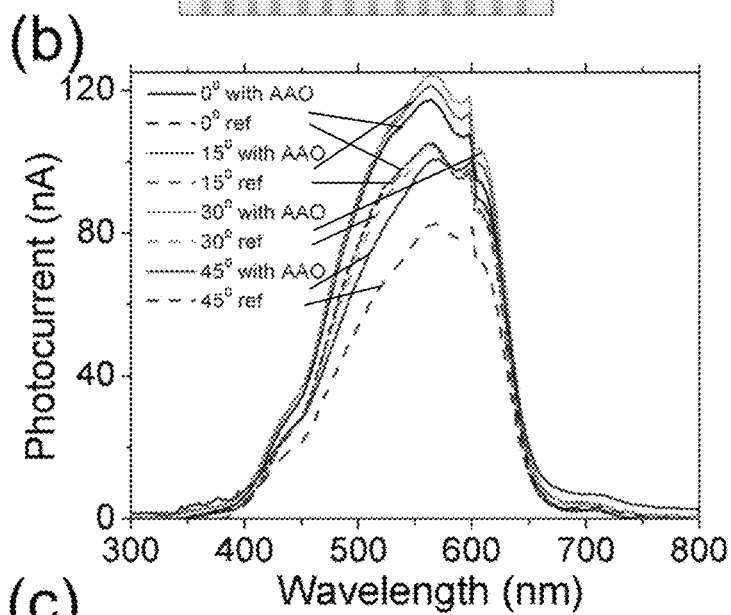
FIG. 7(b) is another graphical representation of experimental data.
Figure 7C:
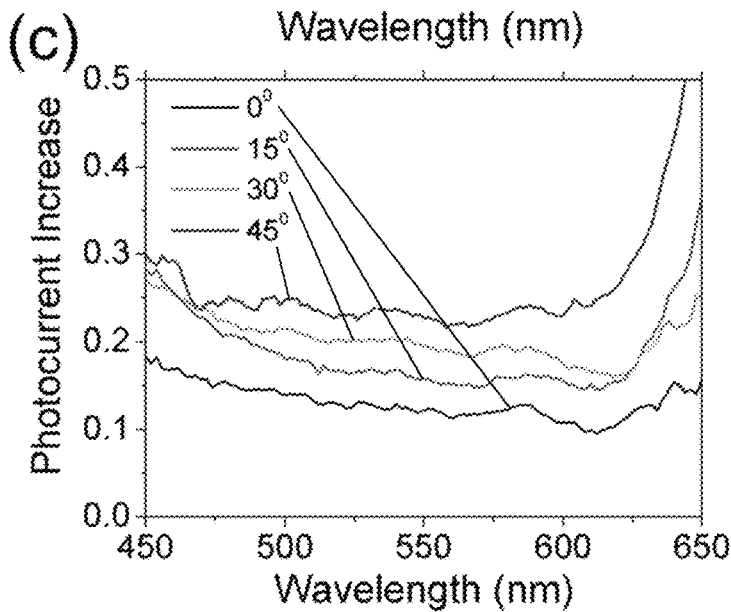
FIG. 7(c) is another graphical representation of experimental data.

A P3HT:PCBM based inverted organic TPV was fabricated to study the applicability of the AAO as an angular dependent back-reflector (FIG. 7(a)). The AAO nanostructured layer was place flushed against the glass, held in place by the surface tension of DI water. Although the DI water provided adequate adhesion and optical coupling between AAO and TPV to illustrate the concept, use of a higher boiling point and low vapor pressure transparent solution (e.g. index matching oil) may be used for more robust and practical implementations. The device was illuminated through the Au window layer at varied angles of incidence. For 0-30 degrees, the illumination beam area was contained within the device area (1 cm²). FIG. 7(b) shows the change in the zero-bias spectral photocurrent at varied angles with (solid-curves) and without (dashed-curves) the AAO nanostructured layer. It was observed that the photocurrent of the TPV with AAO nanostructured layer was higher than the control at all angles (i.e. photocurrent at 564 nm was increased from 105 nA to 117 nA, 121 nA and 124 nA at angles 0, 15 and 30 degrees respectively). Even at 45 degrees, where the baseline photocurrent of the control drops due to the illumination area exceeding the active device area reducing incident optical power density, the AAO nanostructured layer showed higher photocurrent. It was also observed that, unlike the control which does not show change of photocurrent with angle, the AAO nanostructured layer coupled device showed photocurrent increase with increasing angle. FIG. 7(c) illustrates the overall increase in photocurrent with the AAO back scattering at different angles of incidence. Photocurrent at 500 nm was increased by 10 percent at 0 degree to 23 percent at 45 degrees. Furthermore, the photocurrent shows an improvement of close to 23 percent for the entire visible range at 45 degrees. The angle dependent improvement in photocurrent followed closely the increase in backscattering observed in FIG. 6(c).

Figures 8A, 8B:
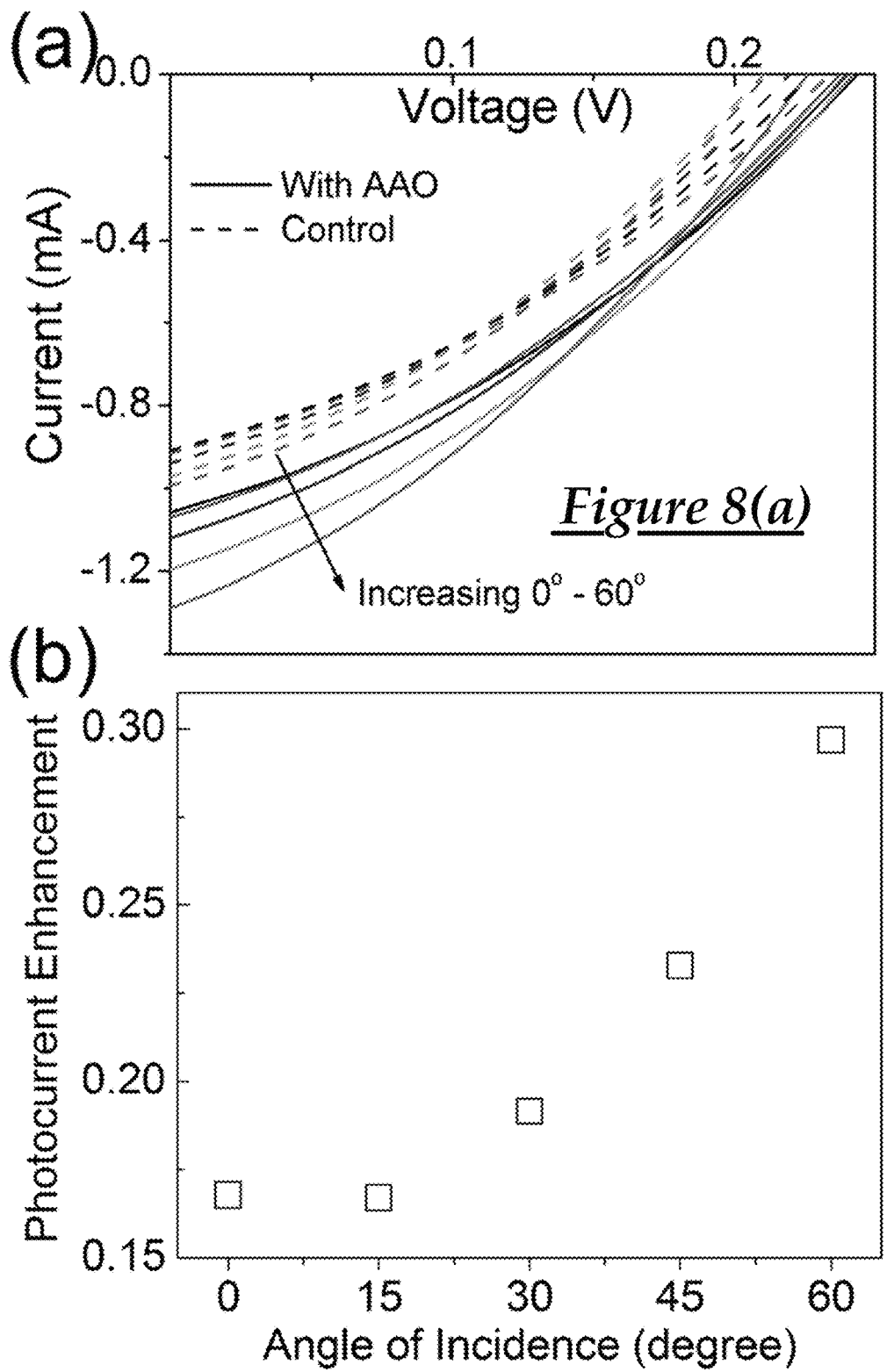
FIG. 8(a) is another graphical representation of experimental data.
FIG. 8(b) is another graphical representation of experimental data.

FIG. 8(a) shows the current-voltage characteristic of the organic TPV under AM1.5 G irradiation, illuminated at different angles, with and without an AAO backscattering layer. The illumination beam area was kept within the active device area such that the photocurrent of the control did not change with the incident angle. At each angle of incidence, the AAO integrated TPV showed higher short circuit current ($J_{sc}$) compared to the control. When the angle was increased from 0-60 degrees, the AAO nanostructured layer integrated TPV showed a distinct increase in $J_{sc}$. With respect to the control TPVs, only a small change in baseline photocurrents was observed, resulting from the illumination spreading over large device area. Apart from the changes in photocurrent, incorporation of the AAO nanostructured layer and/or angular illumination did not significantly change either the open circuit voltage (0.22 V) or the fill factor (0.38) of the control device measured at zero incidence. FIG. 8(b) shows the photocurrent enhancement gained with the AAO backscatter at varied angles of incidence. At greater than 30 degree of angle elevation, the circuit photocurrent was increased more than 20% with a maximum 30% gain at 60 degree.

With the AAO backscattering layer, a 30% photocurrent gain at incident angles greater than 45 degrees orthogonal to the substrate was achieved. Furthermore, optical transmission at a direction orthogonal to the substrate (horizontal) was greater than 85% (600 nm). As a result of using the AAO nanostructured layer, absorption losses were minimized, photocurrent was maximized, and higher transparency was preserved when compared with traditional vertical TPVs. And the angular selective AAO scattering nanostructured layer may be used to fabricate more efficient and functional TPVs for building integrated power generation.

To complement experimental demonstration, the optical scattering of periodic nanopore arrays was explored via finite element numerical modeling. A single rectangular unit cell of a hexagonally close-packed AAO lattice was simulated in COMSOL (see e.g., FIG. 9(a)), bounded by periodic conditions in the x and y directions. A 1 μm thick porous AAO layer (index n=1.65) was defined in the z direction with a surrounding air gap and perfectly matched layers (PML) absorbing boundary conditions. The region was illuminated with a plane wave, and the field scattered by the dielectric structure was calculated for a range of wavelengths and incident angles.

The magnitude and direction of the Poynting vector was sampled in planes above and below the scattering structure. The film's total transmission and backscattering spectra were found, as well as the polar angles φ and θ to which light was scattered.

Figure 9:
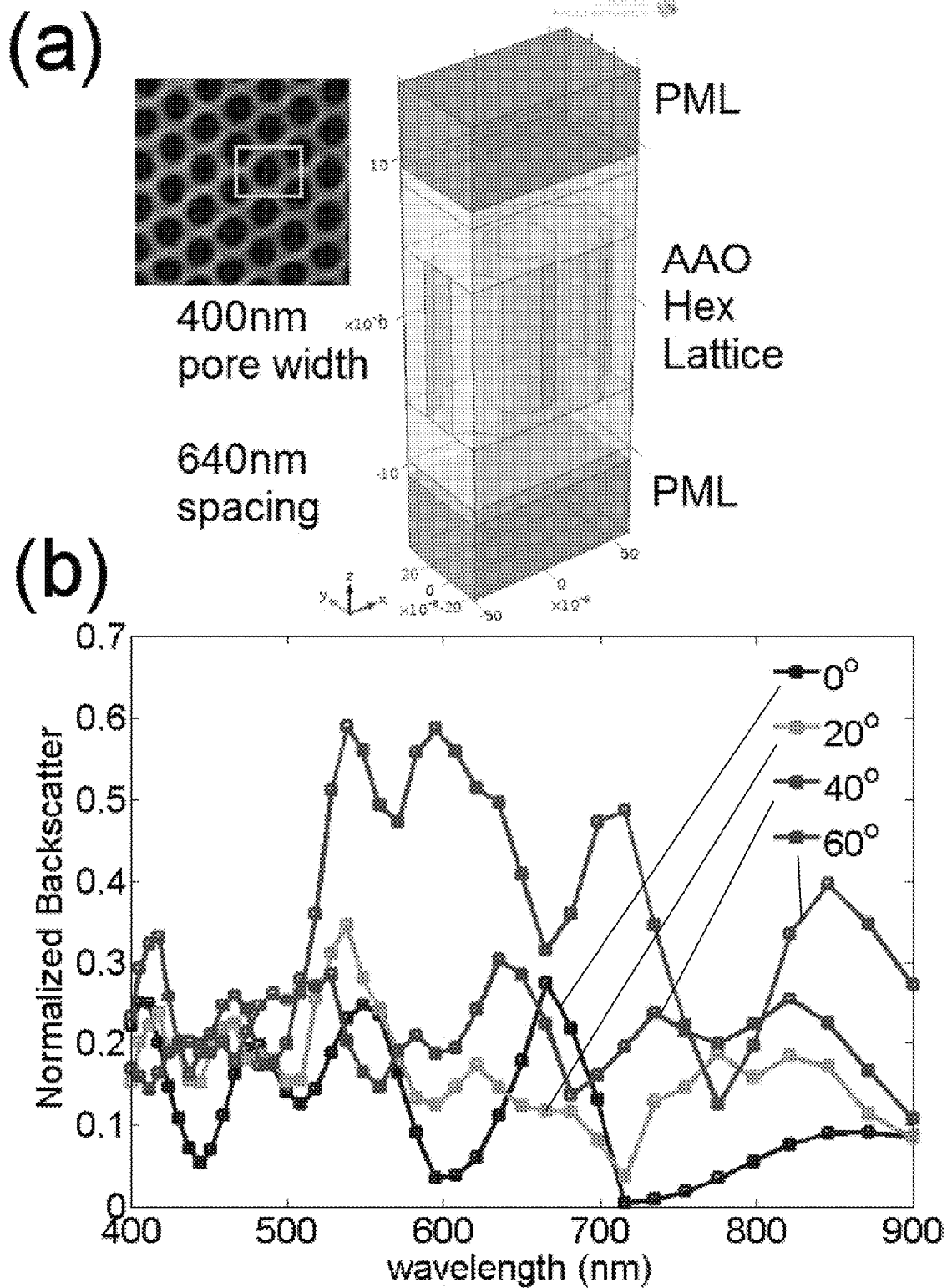
FIG. 9(a) is a diagrammatic perspective view of another embodiment of the backreflective structure.
FIG. 9(b) is another graphical representation of experimental data.

The modeling results of FIG. 9(b) show that backscattering increased with incident angle from ~25% at normal incidence up to 60% at 60 degrees. It was also observed that the scattering peaks could be shifted across the visible spectrum by adjusting the periodicity and pore size of the AAO nanostructured layer, allowing the scattered light to be tuned to the absorption band of any type of accompanying PV material.

Figure 10:
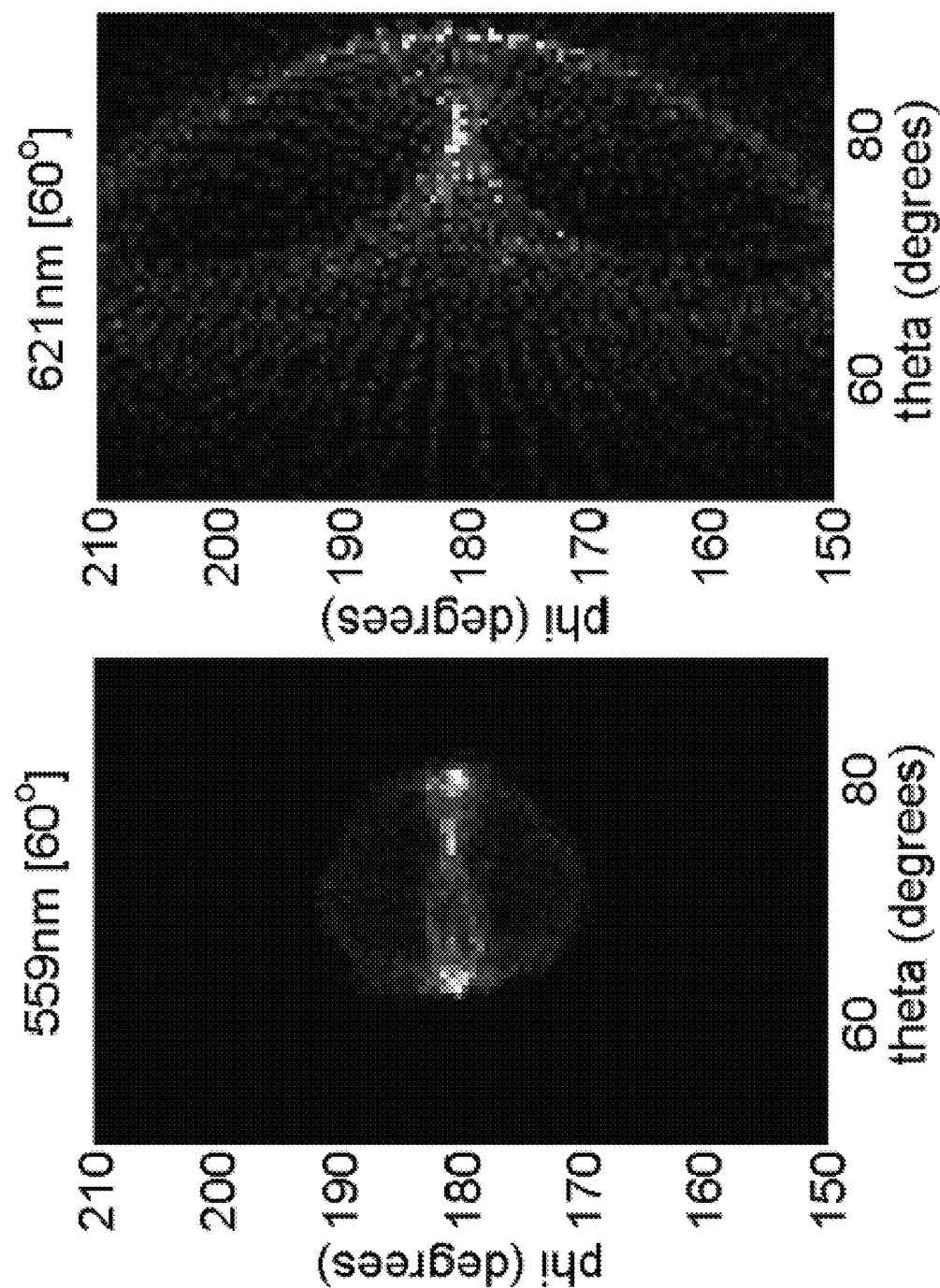
FIG. 10(a) is another graphical representation of experimental data.
FIG. 10(b) is another graphical representation of experimental data.

As shown in FIGS. 10(a) and 10(b), light was backscattered into a range of angles near the spectral peaks. Particularly, it was observed that significant portions of the light were scattered to more extreme (near-horizontal) angles than the angle of incidence. When an AAO nanostructured layer is placed behind a thin absorbing film, these scattered components may have improved geometrical path length on their second pass through the absorber, and may couple to waveguide-like leaky modes with long propagation distance thereby improving total optical absorption.

Now turning to the angle selective semi-transparent PV, from numerical scattering information the corresponding improvements in thin film absorption were evaluated. According to the numerical modeling, the AAO nanostructured layer of FIG. 9(a) was assumed to be placed behind an ultra-thin (20 nm) amorphous Si (a-Si) layer, and a transfer matrix formalism was used to solve for the film's optical properties. Light that was transmitted through the film after a single pass was weighted by the corresponding angular scattering distribution from simulation, and the second pass absorption was calculated over the angular range.

Figure 11:
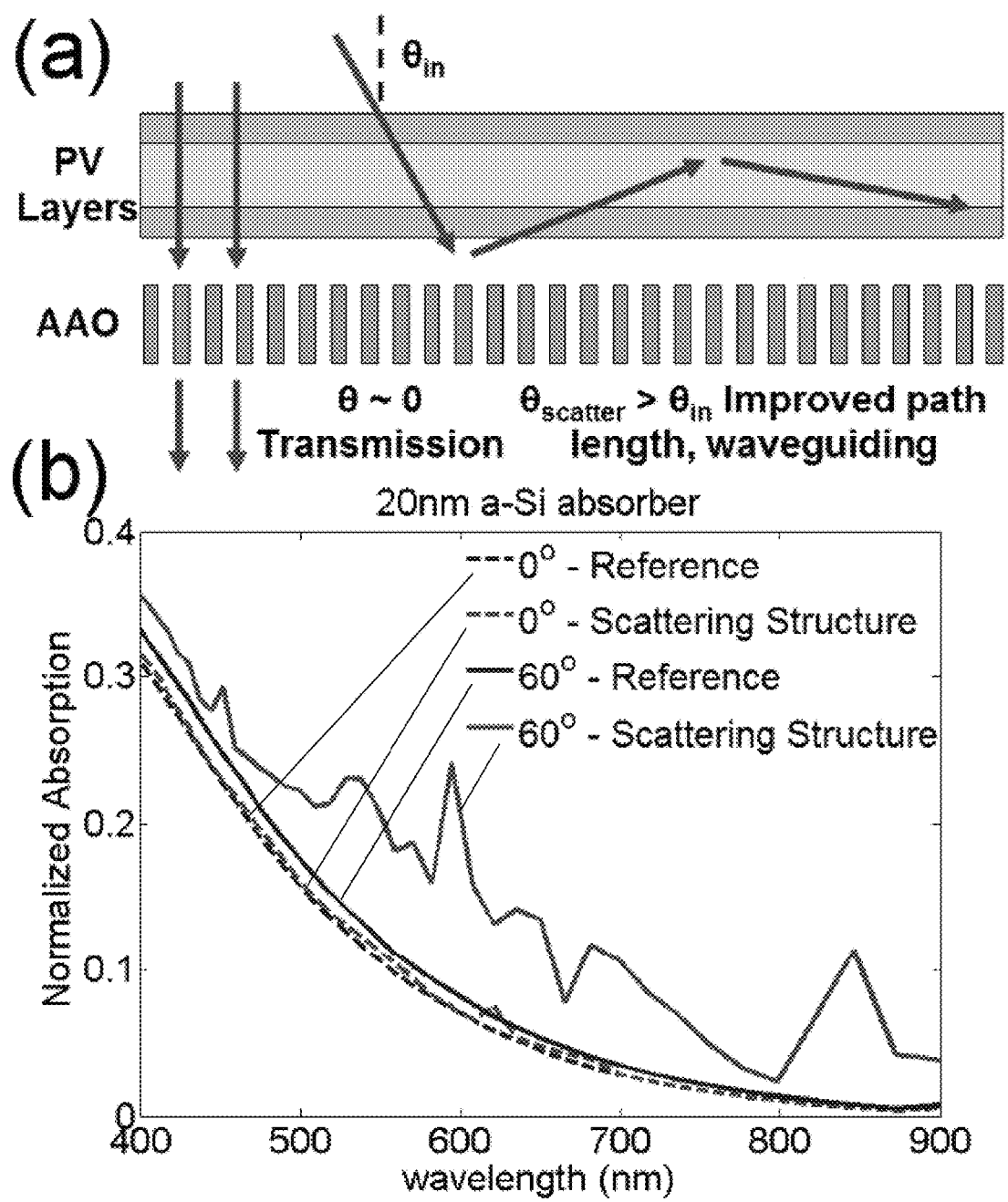
FIG. 11(a) is a diagrammatic view of one embodiment of FIG. 9(a)
FIG. 11(b) is another graphical representation of experimental data.

Optical properties for the angle-sensitive semitransparent PV are shown in FIGS. 11(a) and 11(b). At normal incidence (0 degrees), light made a single pass through the thin absorber and little light was scattered by the AAO nanostructured layer, resulting in minimal absorption and correspondingly high transmission. Band-edge absorption via the scattered light contribution was improved using angled light (60 degrees). Absorption improvement may exceed that of a double-pass due to the long optical path length for light scattered to extreme, near-horizontal angles.

Now turning to the angle insensitivity of thin film PV, in addition to the angle-selective semitransparent system described above, scattering to extreme angles may be used to improve the optical path length in conventional thin film absorbers. Scattering nanopores that are angled with respect to the thin film layers may backscatter even normally incident light at an angle, channeling it toward horizontal propagation and improving optical path length—for example, the thin film layers may be oxidized using aluminum under the influence of an angled electric field. Such a structure optimized to scatter both normal and angled incident light into near-horizontal propagating modes with comparable path lengths may act as an angle insensitive PV and reduce the necessity for solar tracking to maintain consistent absorption throughout the day. Such an approach is diagrammed in FIG. 12(a). Thus, the photoactive device having the previously described angled nanopores may be opaque (i.e., not transparent or semi-transparent).

Figure 12:
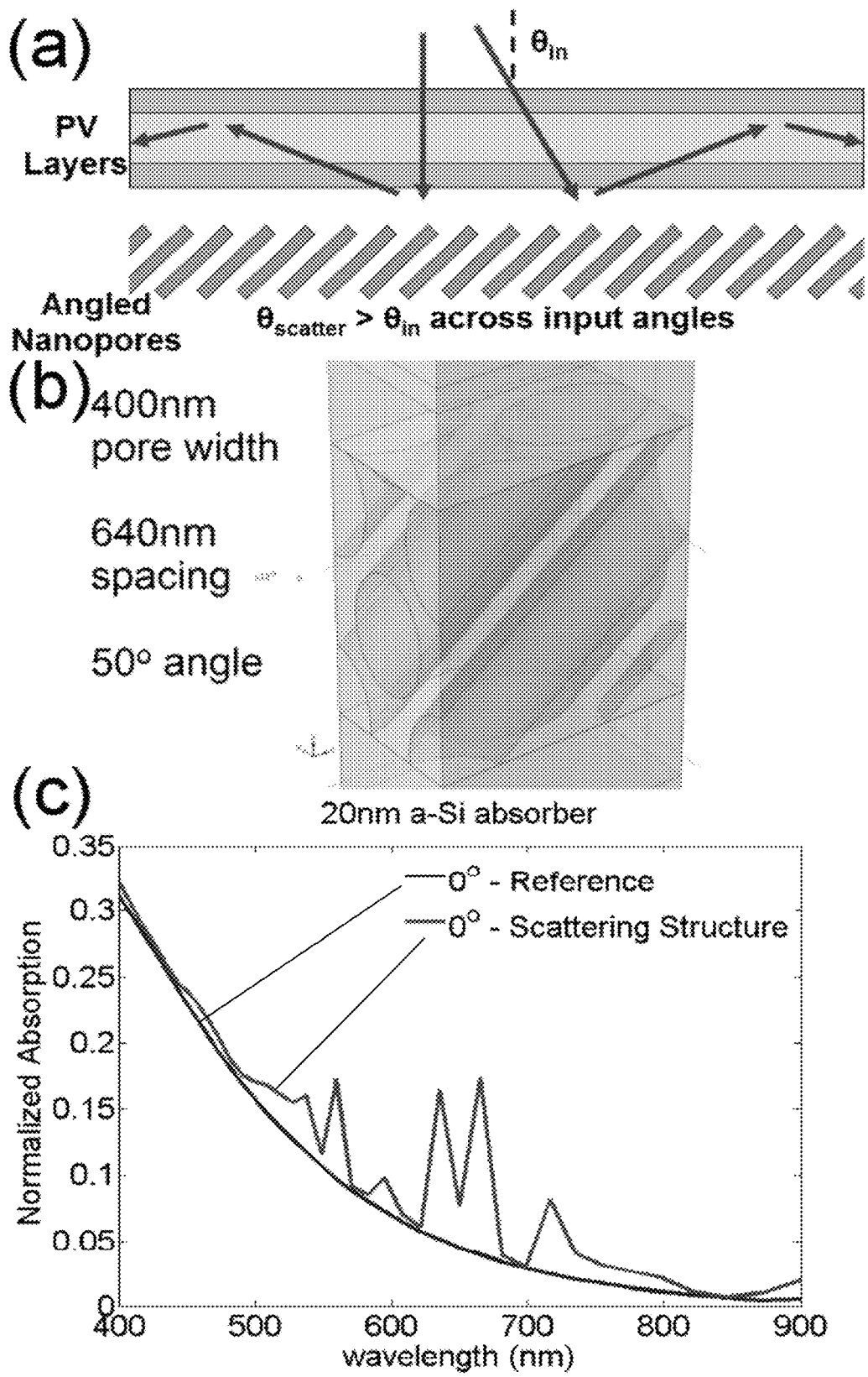
FIG. 12(a) is a diagrammatic view of another exemplary embodiment of FIG. 9(a)
FIG. 12(b) is another diagrammatic perspective view of the embodiment shown in FIG. 12(a)
FIG. 12(c) is another graphical representation of experimental data.

A COMSOL model including AAO pores angled at 50 degrees and illuminated with normal light is shown in FIG. 12(b). Significant backscatter to oblique angles and horizontally propagating modes improved accompanying thin film absorption along the band edge (FIG. 12(c)).

It is to be understood that the foregoing is a description of one or more embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms "e.g.," "for example," "for instance," "such as," and "like," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

The invention claimed is:

1. A photoactive device, comprising:
a photovoltaic device configured to receive incident light, the photovoltaic device having electrodes and one or more layers between the electrodes that includes at least one photoactive layer, wherein the photovoltaic device is configured to absorb a portion of the incident light and to transmit therethrough, at an unchanged angle of incidence, a remaining portion of the incident light that is not absorbed by the photovoltaic device;
a substrate positioned below the photovoltaic device; and
an angular selective nanostructure backreflective layer positioned below the substrate, wherein the photovoltaic device overlays the substrate and the nanostructure backreflective layer such that the nanostructure backreflective layer receives the remaining portion of the incident light transmitted through the photovoltaic device, and wherein the nanostructure backreflective layer includes a plurality of nanoparticles each having an elongated body extending axially along an axis, wherein each of the axes are parallel to one another, wherein the plurality of nanoparticles are arranged within the nanostructure backreflective layer to scatter different portions of the light received from the photovoltaic device, the arrangement of the plurality of nanoparticles being angular selective in that the scattering is based on an angle of the elongated body axes with respect to a surface of the photovoltaic device and the angle of incidence of the remaining portion of the incident light such that at least some of the remaining portion of the incident light received by the backreflective layer at non-orthogonal angles of incidence is reflected back to the photovoltaic device at least in part by interaction of the light with the plurality of nanoparticles, while a majority of light received by the backreflective layer at an orthogonal angle of incidence is passed through the backreflective layer, wherein the elongated body axes of the plurality of nanoparticles are not parallel to the surface of the photovoltaic device.

2. The photoactive device of claim 1 wherein each of the plurality of nanoparticles has an ellipsoid shape.

3. The photoactive device of claim 1 wherein each of the plurality of nanoparticles has a rod-like shape.

4. A photoactive device, comprising:
a photovoltaic device configured to receive incident light, the photovoltaic device having electrodes and one or more layers between the electrodes that includes at least one photoactive layer, wherein the photovoltaic device is configured to absorb a portion of the incident light and to transmit therethrough, at an unchanged angle of incidence, a remaining portion of the incident light that is not absorbed by the photovoltaic device; and a substrate positioned below the photovoltaic device, wherein the photovoltaic device overlays the substrate such that the substrate receives the remaining portion of the incident light transmitted through the photovoltaic device, the substrate comprising a plurality of nanoparticles arranged within the substrate to scatter different portions of the light received from the photovoltaic device, the arrangement of the plurality of nanoparticles being angular selective in that the scattering is based on an orientation of the nanoparticles with respect to a surface of the photovoltaic device and the angle of incidence of the remaining portion of the incident light such that at least some of the remaining portion of the incident light received by the substrate at non-orthogonal angles of incidence is reflected back to the photovoltaic device at least in part by interaction of the light with the plurality of nanoparticles, while a majority of light received by the substrate at an orthogonal angle of incidence is passed through the substrate, wherein each of the plurality of nanoparticles has an elongated body having a major axis and a minor axis, wherein, when each of the plurality of nanoparticles is exposed to the remaining portion of the incident light received by the substrate, a dimension of one of the minor or major axes corresponds with a first resonance within a peak absorption range of the photovoltaic device, wherein the major axes of each of the plurality of nanoparticles are not parallel to the surface of the photovoltaic device.

5. The photoactive device of claim 4 wherein the shape of the plurality of nanoparticles includes at least one of a rod, a circular disk, and an elliptical disk.

6. The photoactive device of claim 4 wherein the nanoparticles are comprised of metal.

7. The photoactive device of claim 6 wherein the metal is silver (Ag).

8. The photoactive device of claim 4 wherein at least some of the plurality of nanoparticles are spaced from one another and oriented at a common angle with respect to the surface of the photovoltaic device.

9. The photoactive device of claim 4 wherein the peak absorption range includes wavelengths outside of a range of visible light that includes 390-700 nanometers (nm).

10. The photoactive device of claim 9 wherein the major axes of each of the plurality of discrete nanoparticles corresponds with the first resonance and the minor axes of each of the plurality of nanoparticles corresponds with a second resonance.

11. The photoactive device of claim 10 wherein the second resonance is outside of the visible range or at least partially within a fringe region of the visible range, the fringe region including 390-430 nm.

* * * * *